(12) United States Patent
Shimizu et al.

(10) Patent No.: US 8,939,818 B2
(45) Date of Patent: Jan. 27, 2015

(54) POLISHING PAD

(75) Inventors: Shinji Shimizu, Osaka (JP); Atsushi Kazuno, Osaka (JP)

(73) Assignee: Toyo Tire & Rubber Co. Ltd., Osaka-shi (JP)

( * ) Notice: Subject to any disclaimer, the term of this patent is extended or adjusted under 35 U.S.C. 154(b) by 57 days.

(21) Appl. No.: 13/579,527

(22) PCT Filed: Feb. 24, 2011

(86) PCT No.: PCT/JP2011/054157
§ 371 (c)(1),
(2), (4) Date: Aug. 16, 2012

(87) PCT Pub. No.: WO2011/105494
PCT Pub. Date: Sep. 1, 2011

(65) Prior Publication Data
US 2012/0309270 A1 Dec. 6, 2012

(30) Foreign Application Priority Data

Feb. 25, 2010 (JP) ................................. 2010-040696
Feb. 3, 2011 (JP) ................................. 2011-021994

(51) Int. Cl.
*C08G 18/76* (2006.01)
*B24B 37/24* (2012.01)
(Continued)

(52) U.S. Cl.
CPC ................ *B24B 37/24* (2013.01); *C08G 18/10* (2013.01); *C08G 18/12* (2013.01);
(Continued)

(58) Field of Classification Search
CPC ........ B24B 37/24; C08G 18/10; C08G 18/12; C08G 18/3206; C08G 18/4238; C08G 18/4854; C08G 18/66774; C08G 18/758; C08G 18/7621; H01L 21/3212
USPC .................................. 451/526, 527, 533, 539
See application file for complete search history.

(56) References Cited

U.S. PATENT DOCUMENTS

| 6,022,268 A | 2/2000 | Roberts et al. |
| 6,217,434 B1 | 4/2001 | Roberts et al. |

(Continued)

FOREIGN PATENT DOCUMENTS

| JP | 8-11050 | 1/1996 |
| JP | 2000-232082 | 8/2000 |

(Continued)

OTHER PUBLICATIONS

International Search Report mailed May 31, 2011, directed to International Application No. PCT/JP2011/054157; 3 pages.

(Continued)

*Primary Examiner* — Lee D Wilson
*Assistant Examiner* — Tyrone V Hall, Jr.
(74) *Attorney, Agent, or Firm* — Morrison & Foerster LLP

(57) ABSTRACT

An object of the invention is to provide a polishing pad which has a polishing layer with a phase-separated structure and can provide high polishing rate and high planarization property and with which scratching can be suppressed. The polishing pad comprises the polishing layer. The polishing layer comprises a product of curing reaction of a polyurethane-forming raw material composition containing: (A) an isocyanate-terminated prepolymer obtained by reaction of a prepolymer-forming raw material composition (a) containing an isocyanate component and a polyester-based polyol; (B) an isocyanate-terminated prepolymer obtained by reaction of a prepolymer-forming raw material composition (b) containing an isocyanate component and a polyether-based polyol; and a chain extender, wherein the product of curing reaction has a phase-separated structure.

6 Claims, 3 Drawing Sheets

(51) Int. Cl.

| | |
|---|---|
| *C08G 18/10* | (2006.01) |
| *C08G 18/12* | (2006.01) |
| *C08G 18/32* | (2006.01) |
| *C08G 18/42* | (2006.01) |
| *C08G 18/48* | (2006.01) |
| *C08G 18/66* | (2006.01) |
| *C08G 18/75* | (2006.01) |
| *C08G 101/00* | (2006.01) |
| *H01L 21/321* | (2006.01) |

(52) U.S. Cl.
CPC ....... *C08G 18/3206* (2013.01); *C08G 18/4238* (2013.01); *C08G 18/4854* (2013.01); *C08G 18/6674* (2013.01); *C08G 18/758* (2013.01); *C08G 18/7621* (2013.01); *C08G 2101/00* (2013.01); *H01L 21/3212* (2013.01)
USPC ............................. 451/527; 451/533; 451/539

(56) References Cited

U.S. PATENT DOCUMENTS

| | | | |
|---|---|---|---|
| 6,287,185 B1 | 9/2001 | Roberts et al. | |
| 6,293,852 B1 | 9/2001 | Roberts et al. | |
| 6,425,816 B1 | 7/2002 | Roberts et al. | |
| 6,682,402 B1 | 1/2004 | Roberts et al. | |
| 7,371,160 B1* | 5/2008 | Cruz et al. | ................... 451/526 |
| 2002/0077036 A1 | 6/2002 | Roberts et al. | |
| 2002/0155801 A1 | 10/2002 | Roberts et al. | |
| 2004/0048562 A1 | 3/2004 | Roberts et al. | |
| 2004/0048564 A1 | 3/2004 | Roberts et al. | |
| 2005/0222336 A1* | 10/2005 | Okamoto et al. | ............. 525/194 |
| 2006/0108701 A1 | 5/2006 | Saikin | |
| 2009/0093201 A1* | 4/2009 | Kazuno et al. | ................. 451/533 |
| 2009/0104850 A1 | 4/2009 | Ogawa et al. | |
| 2011/0218263 A1* | 9/2011 | Kazuno et al. | ................. 521/155 |
| 2012/0100783 A1* | 4/2012 | Itoyama et al. | ................. 451/36 |
| 2012/0202409 A1* | 8/2012 | Shinchi et al. | ................. 451/526 |

FOREIGN PATENT DOCUMENTS

| | | |
|---|---|---|
| JP | 2001-518852 | 10/2001 |
| JP | 2006-148135 | 6/2006 |
| JP | 2007-42923 | 2/2007 |
| JP | 2008-173760 | 7/2008 |
| WO | WO-2007/026569 | 3/2007 |

OTHER PUBLICATIONS

Notice to Submit a Response dated Sep. 26, 2013, directed to KR Application No. 10-2012-7012315; 7 pages.

Notification of Reasons for Refusal mailed Jun. 20, 2014, directed to JP Application No. 2011-021994; 4 pages.

Notice to Submit a Response dated Mar. 26, 2014, directed to KR Application No. 10-2012-7012315; 7 pages.

Notification of the First Office Action dated Feb. 20, 2014, directed to CN Application No. 201180004980.7; 15 pages.

Office Action received Jan. 23, 2014 directed towards TW Application No. 100106430; 10 pages.

* cited by examiner

POLISHING PAD

REFERENCE TO RELATED APPLICATIONS

This application is a national stage application under 35 USC 371 of International Application No. PCT/JP2011/054157, filed Feb. 24, 2011, which claims the priority of Japanese Patent Application No. 2010-040696, filed Feb. 25, 2010, and Japanese Patent Application No. 2011-021994, filed Feb. 3, 2011, the entire contents of which are incorporated herein by reference.

FIELD OF THE INVENTION

The invention relates to a polishing pad capable of performing planarization of materials requiring a high surface planarity such as optical materials including a lens and a reflecting mirror, a silicon wafer, a glass substrate or an aluminum substrates for a hard disc and a product of general metal polishing with stability and a high polishing efficiency. A polishing pad of the invention is preferably employed, especially, in a planarization step of a silicon wafer or a device on which an oxide layer or a metal layer has been formed prior to further stacking an oxide layer or a metal layer thereon.

BACKGROUND OF THE INVENTION

Typical materials requiring surface flatness at high level include a single-crystal silicon disk called a silicon wafer for producing semiconductor integrated circuits (IC, LSI). The surface of the silicon wafer should be flattened highly accurately in a process of producing IC, LSI etc., in order to provide reliable semiconductor connections for various coatings used in manufacturing the circuits. In the step of polishing finish, a polishing pad is generally stuck on a rotatable supporting disk called a platen, while a workpiece such as a semiconductor wafer is stuck on a polishing head. By movement of the two, a relative speed is generated between the platen and the polishing head while polishing slurry having abrasive grains is continuously supplied to the polishing pad, to effect polishing processing.

As polishing characteristics of a polishing pad, it is requested that a material being polished is excellent in planarity and in-plane uniformity and a polishing rate is large. A planarity and in-plane uniformity of a material being polished can be improved to some extent with a polishing layer higher in elastic modulus. A polishing rate can be bettered by increasing a holding quantity of a slurry on a foam with cells therein.

For example, Patent Document 1 discloses a polishing cloth for use in planarizing a material having a step, which includes a polishing surface having parts with different degrees of surface hardness, wherein the parts with different degrees of surface hardness are formed by phase separation of resin that forms the surface.

Patent Document 2 discloses a polishing pad useful for planarization, which includes a polymer matrix containing a dispersed elastomeric polymer and having a glass transition temperature higher than room temperature, wherein the elastomeric polymer has an average length of at least 0.1 µm in at least one direction, makes up 1 to 45% by volume of the polishing pad, and has a glass transition temperature lower than room temperature.

Considering the development of next-generation devices, there is a demand for high-hardness polishing pads capable of further increasing planarity. In order to increase planarity, non-foamed, hard polishing pads may also be used. In the case where such hard pads are used, however, a problem may occur in which scratches (scars) are more likely to occur on the surface of the material being polished.

Patent Document 3 discloses a polishing pad for use in polishing Cu films, which has a polishing layer made of a polyurethane resin foam so that scratching can be less likely to occur, wherein the polyurethane resin foam is a product of curing reaction of a chain extender with an isocyanate-terminated prepolymer containing an isocyanate component and a high-molecular weight polyol component as raw material components, and the high-molecular weight polyol component contains 30% by weight or more of polyester polyol.

Patent Document 1: JP-A-08-11050
Patent Document 2: JP-A-2008-173760
Patent Document 3: JP-A-2007-42923

SUMMARY OF THE INVENTION

An object of the invention is to provide a polishing pad which has a polishing layer with a phase-separated structure and can provide high polishing rate and high planarization property and with which scratching can be suppressed. Another object of the invention is to provide a semiconductor device-manufacturing method using such a polishing pad.

As a result of earnest studies to solve the above problems, the inventors have accomplished the invention based on the finding that the objects can be achieved by the polishing pad described below.

Thus, the invention is directed to a polishing pad having a polishing layer, wherein the polishing layer includes a product of curing reaction of a polyurethane-forming raw material composition containing: (A) an isocyanate-terminated prepolymer obtained by reaction of a prepolymer-forming raw material composition (a) containing an isocyanate component and a polyester-based polyol; (B) an isocyanate-terminated prepolymer obtained by reaction of a prepolymer-forming raw material composition (b) containing an isocyanate component and a polyether-based polyol; and a chain extender, wherein the product of curing reaction has a phase-separated structure.

By focusing attention on the properties of polyester-based and polyether-based polyols incompatible with each other, the inventors have found that a curing reaction product having a macroscopic phase-separated structure can be obtained by curing reaction of a chain extender or the like with an isocyanate-terminated prepolymer (A) and another isocyanate-terminated prepolymer (B) used as raw materials, which are synthesized separately and obtained by reaction of a prepolymer-forming raw material composition (a) containing an isocyanate component and a polyester-based polyol and by reaction of a prepolymer-forming raw material composition (b) containing an isocyanate component and a polyether-based polyol, respectively. The inventors have also found that when a polishing layer is formed using the curing reaction product, a polishing pad can be obtained which provides high polishing rate and high planarization property and with which scratching can be suppressed. More specifically, the surface of such a polishing layer can be well-dressed (by cutting) with a conditioner, so that it can have higher polishing property and therefore can provide higher polishing rate. In addition, the overall hardness of such a polishing layer is high so that a high level of planarization property can be provided, and in part, such a polishing layer also has low-hardness regions formed by the phase separation so that scratching can be effectively suppressed.

The phase-separated structure preferably has island and sea components, in which the island component preferably has an average maximum length of 0.5 to 100 µm. When the phase-separated structure has a sea-island structure including sea and island components, the above advantageous effects are enhanced. In the case where the island component has an average maximum length of less than 0.5 µm, the phase-separated structure may be close to a usual micro-phase-separated structure, which includes hard and soft segments of polyurethane resin, so that the ability to dress the surface of the polishing layer may be low and that the effect of increasing polishing rate may tend to be insufficient. In the case where it is more than 100 µm, the overall rigidity of the polishing layer may be low so that the effect of increasing planarization property may tend to be insufficient.

The island component is preferably made of a curing reaction product including the isocyanate-terminated prepolymer (A) as a main component, and the sea component is preferably made of a curing reaction product including the isocyanate-terminated prepolymer (B) as a main component. The curing reaction product including the isocyanate-terminated prepolymer (A) as a main component tends to have lower rigidity than the curing reaction product including the isocyanate-terminated prepolymer (B) as a main component, because the ester group of the polyester-based polyol, which is a component of the prepolymer (A), undergoes hydrolysis. Therefore, in the case where the sea component, which occupies a region larger than the island component, is made of the curing reaction product including the isocyanate-terminated prepolymer (A) as a main component, the overall rigidity of the polishing layer may tend to be reduced so that the effect of increasing planarization property may tend to be insufficient.

The total content of the oxycarbonyl group constituting the polyester-based polyol is preferably from 8 to 43% by weight based on the total weight of high-molecular weight polyols in the prepolymer-forming raw material compositions (a) and (b). In the case where the content of the oxycarbonyl group is less than 8% by weight, it may tend to be difficult to form a curing reaction product having a macroscopic phase-separated structure. In the case where the content is more than 43% by weight, not only it may be difficult to form a curing reaction product having a macroscopic phase-separated structure, but also hydrolysis of the ester group may more frequently occur, and the rigidity of the polishing layer may be reduced, so that the effect of increasing planarization property may tend to be insufficient.

The polyester-based polyol is preferably at least one selected from the group consisting of polyethylene adipate glycol, polybutylene adipate glycol, and polyhexamethylene adipate glycol. The polyether-based polyol is preferably polytetramethylene ether glycol.

The invention is also directed to a method for manufacturing a semiconductor device, which includes the step of polishing the surface of a semiconductor wafer using the above polishing pad.

DETAILED DESCRIPTION OF THE INVENTION

Figure 1:
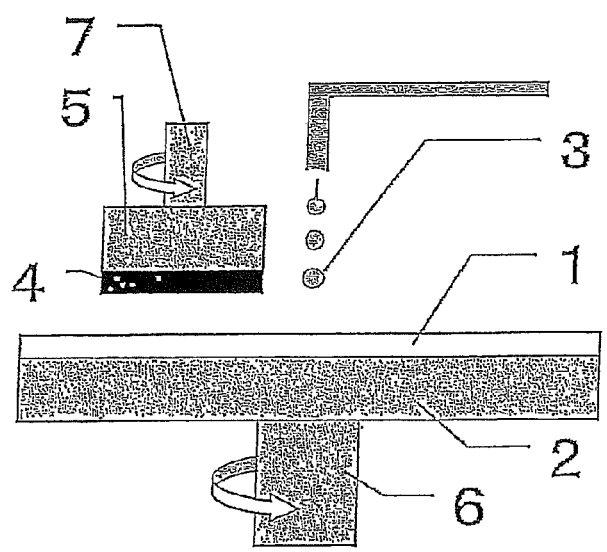
FIG. 1 is a schematic diagram showing an exemplary polishing apparatus used in chemical mechanical polishing (CMP)
Figure 2:
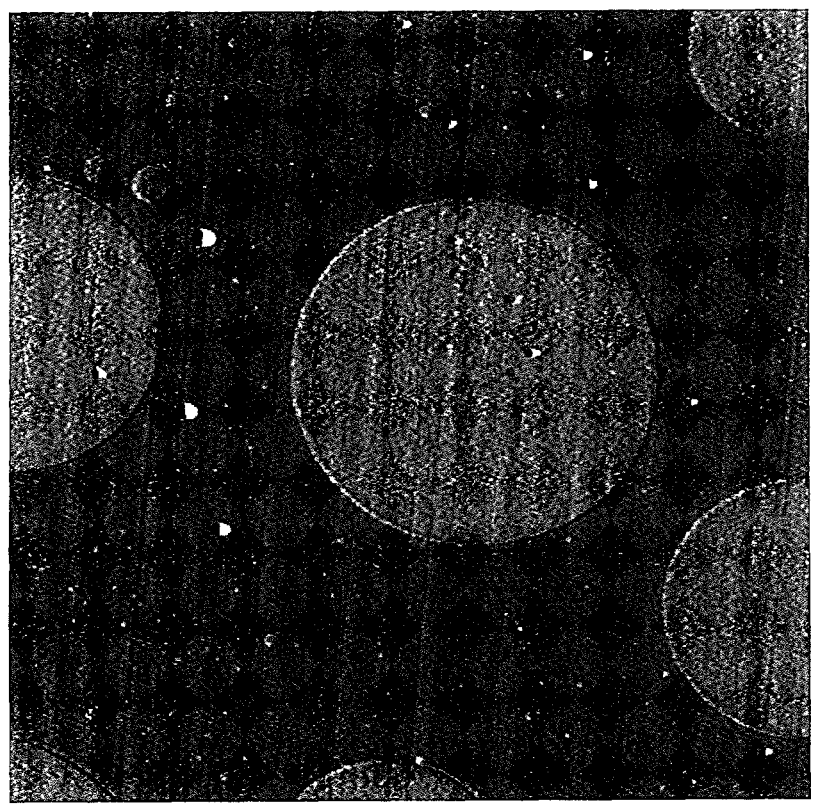
FIG. 2 is an image of the surface of a polishing layer prepared in Example 12, which is measured using a scanning probe microscope.
Figure 3:
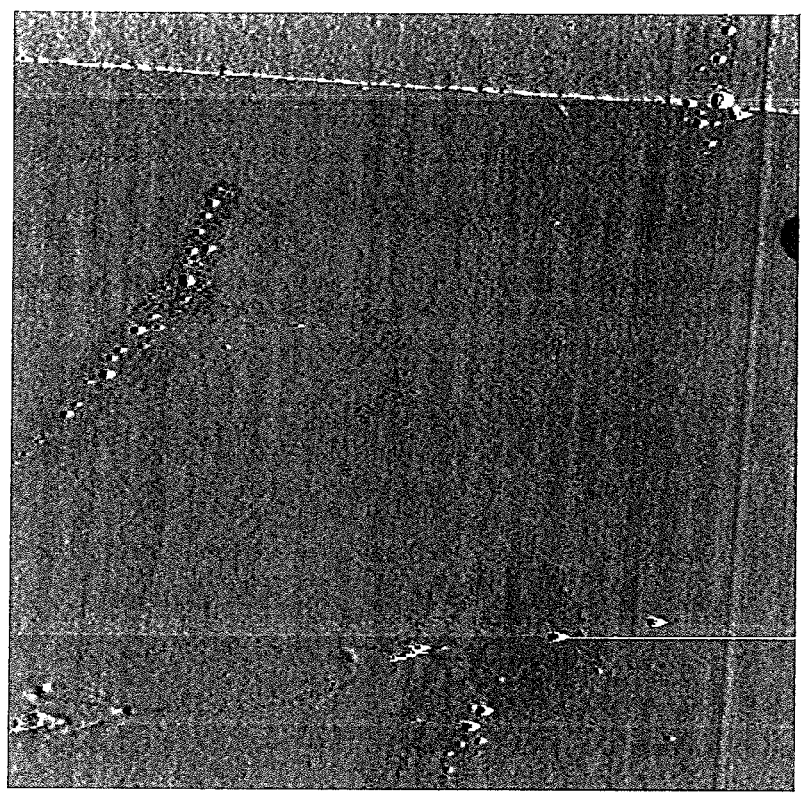
FIG. 3 is an image of the surface of a polishing layer prepared in Comparative Example 8, which is measured using a scanning probe microscope.

The polishing pad of the invention includes a polishing layer including a polyurethane resin. The polishing pad of the invention may be only the polishing layer or a laminated body of the polishing layer and any other layer (such as a cushion layer).

Polyurethane is a preferred material for forming the polishing layer, because polyurethane is excellent in abrasion resistance and polymers with desired physical properties can be easily obtained by varying the raw material composition.

The polishing layer is made of a product of curing reaction of a polyurethane-forming raw material composition containing: (A) an isocyanate-terminated prepolymer obtained by reaction of a prepolymer-forming raw material composition (a) containing an isocyanate component and a polyester-based polyol; (B) an isocyanate-terminated prepolymer obtained by reaction of a prepolymer-forming raw material composition (b) containing an isocyanate component and a polyether-based polyol; and a chain extender, in which the curing reaction product has a phase-separated structure.

As the isocyanate component, a compound known in the field of polyurethane can be used without particular limitation. The isocyanate monomer includes, for example, aromatic diisocyanates such as 2,4-toluene diisocyanate, 2,6-toluene diisocyanate, 2,2'-diphenyl methane diisocyanate, 2,4'-diphenyl methane diisocyanate, 4,4'-diphenyl methane diisocyanate, 1,5-naphthalene diisocyanate, p-phenylene diisocyanate, m-phenylene diisocyanate, p-xylylene diisocyanate and m-xylylene diisocyanate, aliphatic diisocyanates such as ethylene diisocyanate, 2,2,4-trimethyl hexamethylene diisocyanate and 1,6-hexamethylene diisocyanate, and cycloaliphatic diisocyanates such as 1,4-cyclohexane diisocyanate, 4,4'-dicyclohexyl methane diisocyanate, isophorone diisocyanate and norbornane diisocyanate. These may be used alone or as a mixture of two or more thereof. Among them, an aromatic diisocyanate is preferably used, and in particular, toluene diisocyanate is preferably used, in the process of preparing the isocyanate-terminated prepolymer (A). In the process of preparing the isocyanate-terminated prepolymer (B), an aromatic diisocyanate is preferably used in combination with an alicyclic diisocyanate, and in particular, toluene diisocyanate is preferably used in combination with dicyclohexylmethane diisocyanate.

Besides the above diisocyanate, a tri- or polyfunctional isocyanate may also be used.

Examples of the polyester-based polyol include polyester polyols such as polyethylene adipate glycol, polypropylene adipate glycol, polybutylene adipate glycol, polyhexamethylene adipate glycol, and polycaprolactone polyol; a product of reaction between alkylene carbonate and a polyester glycol such as polycaprolactone polyol; and polyester polycarbonate polyols such as products obtained by a process including allowing a polyhydric alcohol to react with ethylene carbonate and then allowing the resulting reaction mixture to react with an organic dicarboxylic acid. These may be used singly or in combination of two or more. Among them, at least one polyester polyol selected from the group consisting of polyethylene adipate glycol, polybutylene adipate glycol, and polyhexamethylene adipate glycol is preferably used.

The number average molecular weight of the polyester-based polyol is preferably, but not limited to, 200 to 5,000, more preferably 500 to 2,000, in view of the phase-separated structure and viscoelastic properties of the polyurethane resin to be obtained. In the case where the number average molecular weight is less than 200, the phase-separated structure may tend to be difficult to form. On the other hand, in the case where the number average molecular weight is more than 5,000, there may be a tendency to obtain a soft polyurethane resin so that the planarization property may tend to be reduced.

While it is preferred that only the polyester-based polyol should be added as a high-molecular weight polyol to the prepolymer-forming raw material composition (a), any other known high-molecular weight polyol (with a number average molecular weight of about 200 to about 5,000) may also be added as long as the objects of the invention are not compromised. It should be noted that when any other high-molecular weight polyol is also used at the same time, the polyester-based polyol for forming a macroscopic phase-separated structure should preferably be added so that the total content of the oxycarbonyl group constituting the polyester-based polyol is from 8 to 43% by weight based on the total amount of the high-molecular weight polyols in the prepolymer-forming raw material compositions (a) and (b).

Examples of the polyether-based polyol include polyether polyols such as polyethylene glycol (PEG), polypropylene glycol (PPG), polytetramethylene ether glycol (PTMG), and polyhexamethylene ether glycol (PHMG); and polyether polycarbonate polyols such as products obtained by reaction of a diol(s) such as 1,3-propanediol, 1,4-butanediol, 1,6-hexanediol, polypropylene glycol, and/or polytetramethylene glycol with phosgene or a diallyl carbonate (such as diphenyl carbonate) or a cyclic carbonate (such as propylene carbonate). These may be used singly or in combination of two or more. In particular, polytetramethylene ether glycol is preferably used.

The number average molecular weight of the polyether-based polyol is preferably, but not limited to, 200 to 5,000, more preferably 500 to 2,000, in view of the viscoelastic properties of the polyurethane resin to be obtained. In the case where the number average molecular weight is less than 200, a hard and brittle polyurethane resin may be obtained, so that scratching may tend to be difficult to suppress or pad life may tend to be short. On the other hand, in the case where the number average molecular weight is more than 5,000, there may be a tendency to obtain a soft polyurethane resin so that the planarization property may tend to be reduced.

While it is preferred that only the polyether-based polyol should be added as a high-molecular weight polyol to the prepolymer-forming raw material composition (b), any other known high-molecular weight polyol (with a number average molecular weight of about 200 to about 5,000) may also be added as long as the objects of the invention are not compromised.

Low-molecular weight components such as a low-molecular weight polyol, a low-molecular weight polyamine, and an alcoholamine may also be added to the prepolymer-forming raw material compositions (a) and (b). In particular, such low-molecular weight components are preferably added to the prepolymer-forming raw material composition (b).

Examples of the low-molecular weight polyol include ethylene glycol, 1,2-propylene glycol, 1,3-propylene glycol, 1,2-butanediol, 1,3-butanediol, 1,4-butanediol, 2,3-butanediol, 1,6-hexanediol, neopentyl glycol, 1,4-cyclohexanedimethanol, 3-methyl-1,5-pentanediol, diethylene glycol, triethylene glycol, 1,4-bis(2-hydroxyethoxy)benzene, trimethylolpropane, glycerin, 1,2,6-hexanetriol, pentaerythritol, tetramethylolcyclohexane, methylglucoside, sorbitol, mannitol, dulcitol, sucrose, 2,2,6,6-tetrakis(hydroxymethyl)cyclohexanol, diethanolamine, N-methyldiethanolamine, and triethanolamine. One or more of these polyols may be used alone or in any combination.

Examples of the low-molecular weight polyamine include ethylenediamine, tolylenediamine, diphenylmethanediamine, diethylenetriamine, etc. These may be used singly or in combination of two or more.

Examples of the alcoholamine include monoethanolamine, 2-(2-aminoethylamino)ethanol, monopropanolamine, etc. These may be used singly or in combination of two or more.

The content of the low-molecular weight component in the prepolymer-forming raw material composition (b) is not particularly restricted and may be appropriately determined depending on the properties required of the polishing pad (polishing layer). Preferably, however, the content of the low-molecular weight component is from 10 to 70% by mole based on the total amount of the active hydrogen group-containing compounds in the prepolymer-forming raw material composition (b).

In addition, each component is preferably added so that the total content of the oxycarbonyl group constituting the polyester-based polyol is from 8 to 43% by weight based on the total weight of the high-molecular weight polyols in the prepolymer-forming raw material compositions (a) and (b).

In a case where a polyurethane foam is produced by means of a prepolymer method, a chain extender is used in curing of a prepolymer. A chain extender is an organic compound having at least two active hydrogen groups and examples of the active hydrogen group include: a hydroxyl group, a primary or secondary amino group, a thiol group (SH) and the like. Concrete examples of the chain extender include: polyamines such as 4,4'-methylenebis(o-chloroaniline)(MOCA), 2,6-dichloro-p-phenylenediamine, 4,4'-methylenebis(2,3-dichloroaniline), 3,5-bis(methylthio)-2,4-toluenediamine, 3,5-bis(methylthio)-2,6-toluenediamine, 3,5-diethyltoluene-2,4-diamine, 3,5-diethyltoluene-2,6-diamine, trimethylene glycol-di-p-aminobenzoate, polytetramethylene oxide-di-p-aminobenzoate, 4,4'-diamino-3,3',5,5'-tetraethyldiphenylmethane, 4,4'-diamino-3,3'-diisopropyl-5.5'-dimethyldiphenylmethane, 4,4'-diamino-3,3',5,5'-tetraisopropyldiphenylmethane, 1,2-bis(2-aminophenylthio)ethane, 4,4'-diamino-3,3'-diethyl-5.5'-dimethyldiphenylmethane, N,N'-di-sec-butyl-4,4'-diaminophenylmethane, 3,3'-diethyl-4,4'-diaminodiphenylmethane, m-xylylenediamine, N,N'-di-sec-butyl-p-phenylenediamine, m-phenylenediamine and p-xylylenediamine; the low-molecular weight polyol; and the low-molecular weight polyamine. The chain extenders described above may be used either alone or in mixture of two kinds or more.

The mixing ratio of the isocyanate-terminated prepolymer (A), the isocyanate-terminated prepolymer (B), and the chain extender may be varied depending on the molecular weight of each material and the desired physical properties of the polishing pad. The amount of addition of the isocyanate-terminated prepolymer (A) is preferably from 15 to 570 parts by weight based on 100 parts by weight of the isocyanate-terminated prepolymer (B). Further, in order to obtain a polishing pad having desired polishing properties, the number of isocyanate groups (NCO Index) in the prepolymers is preferably from 0.8 to 1.2, more preferably from 0.99 to 1.15 per the number of active hydrogen groups (hydroxyl groups and/or amino groups) in the chain extender. If the number of isocyanate groups is outside the range, insufficient curing could occur so that the required specific gravity or hardness could not be achieved, which tends to decrease the polishing properties.

The polyurethane resin (cured product) is preferably produced by melting method in view of cost, working environment and so on, while it may be produced by application of any known urethane foaming techniques such as melting method and solution technique.

According to the invention, the polyurethane resin production is performed using a prepolymer process. Polyurethane resin produced by prepolymer process has a preferably excellent physical properties.

Note that an isocyanate-terminated prepolymer (A) and (B) with a molecular weight of the order in the range of from 300 to 5000 is preferable because of excellency in workability and physical properties.

In the invention, the polyurethane resin is produced by curing reaction of a polyurethane-forming raw material composition containing the isocyanate-terminated prepolymer (A), the isocyanate-terminated prepolymer (B), and the chain extender.

The polyurethane resin may be a foamed product or a non-foamed product. The polyurethane resin may be produced by a batch process including measuring and adding each component to a vessel and stirring the components or by a continuous manufacturing process including continuously supplying each component to a stirring apparatus, stirring the components, feeding the liquid mixture, and producing a molded product.

The polishing layer may be produced by a process including adding the isocyanate-terminated prepolymers (A) and (B) to a reaction vessel, then adding the chain extender thereto, stirring them, and then pouring the mixture into a casting mold with a predetermined size to form a polyurethane resin block, and slicing the block using a slicer, or forming thin sheets at the stage of the cast molding. Alternatively, the polyurethane resin as a raw material may be melted and extruded from a T-die to form a sheet-shaped polishing layer directly.

The method of producing the polyurethane foam may be a method of adding hollow beads, a mechanical foaming method (including mechanical frothing), a chemical foaming method, or the like. While any combination of these methods may be used, in particular, a mechanical foaming method is preferably performed using a silicone surfactant comprising a copolymer of polyalkylsiloxane and polyether. Compounds suitable as the silicone surfactant include SH-192 and L-5340 (manufactured by Dow Corning Toray Silicone Co., Ltd.), B8443 and B8465 (manufactured by Goldschmidt Chemical Corporation), etc. The silicone surfactant is preferably added at a concentration of 0.05 to 10% by weight, more preferably 0.1 to 5% by weight, to the polyurethane-forming raw material composition.

Various additives may be mixed; such as a stabilizer including an antioxidant, a lubricant, a pigment, a filler, an antistatic agent and others.

Description will be given of an example of a method of producing a polyurethane foam of a fine cell type constituting a polishing pad (a polishing layer) below. A method of manufacturing such a polyurethane foam has the following steps:

1) Foaming Step of Preparing Cell Dispersion Liquid

The step includes adding a silicone surfactant to the first component containing the isocyanate-terminated prepolymers (A) and (B) so that the polyurethane foam will contain 0.05 to 10% by weight of the silicone surfactant and stirring the mixture in the presence of a non-reactive gas to form a cell dispersion liquid in which the non-reactive gas is dispersed in the form of fine cells. In a case where the prepolymer is solid at an ordinary temperature, the prepolymer is preheated to a proper temperature and used in a molten state.

2) Curing Agent (Chain Extender) Mixing Step

The second component containing a chain extender is added into the cell dispersion liquid, which is agitated to thereby obtain a foaming reaction liquid.

3) Casting Step

The forming reaction liquid is cast into a mold.

4) Curing Step

The foaming reaction liquid having been cast into the mold is heated and reaction-cured.

The non-reactive gas used for forming fine cells is preferably not combustible, and is specifically nitrogen, oxygen, a carbon dioxide gas, a rare gas such as helium and argon, and a mixed gas thereof, and the air dried to remove water is most preferable in respect of cost.

As a stirrer for dispersing the silicone surfactant-containing first component to form fine cells with the non-reactive gas, known stirrers can be used without particular limitation, and examples thereof include a homogenizer, a dissolver, a twin-screw planetary mixer etc. The shape of a stirring blade of the stirrer is not particularly limited either, but a whipper-type stirring blade is preferably used to form fine cells. In order to obtain the desired polyurethane foam, the number of revolutions of the stirring blade is preferably from 500 to 2,000 rpm, more preferably from 800 to 1,500 rpm. The stirring time should be appropriately controlled depending on the desired density.

In a preferable mode, different stirrers are used in stirring for forming a cell dispersion liquid in the stirring step and in stirring for mixing an added chain extender in the mixing step, respectively. In particular, stirring in the mixing step may not be stirring for forming cells, and a stirrer not generating large cells is preferably used. Such a stirrer is preferably a planetary mixer. The same stirrer may be used in the stirring step and the mixing step, and stirring conditions such as revolution rate of the stirring blade are preferably regulated as necessary.

In the method of producing the polyurethane foam with fine cells, heating and post-curing of the foam obtained after casting and reacting the forming reaction liquid in a mold until the dispersion lost fluidity are effective in improving the physical properties of the foam, and are extremely preferable. The forming reaction liquid may be cast in a mold and immediately post-cured in a heating oven, and even under such conditions, heat is not immediately conducted to the reactive components, and thus the diameters of cells are not increased. The curing reaction is conducted preferably at normal pressures to stabilize the shape of cells.

A known catalyst promoting polyurethane reaction, such as tertiary amine-based catalysts, may be used. The type and amount of the catalyst added are determined in consideration of flow time in casting in a predetermined mold after the mixing step.

The average cell diameter of the polyurethane foam is preferably from 20 to 70 μm, more preferably from 30 to 60 μm.

The polyurethane foam preferably has an Asker D hardness of 35 to 65 degrees, more preferably 40 to 65 degrees.

The non-foamed polyurethane preferably has an Asker D hardness of 45 to 75 degrees, more preferably 45 to 65 degrees.

The polyurethane foam preferably has a specific gravity of 0.4 to 1.0.

The polishing layer comprising the polyurethane resin has a phase-separated structure, in particular, which preferably has a sea-island structure including a sea component and an island component with an average maximum length of 0.5 to 100 μm. The average maximum length of the island component is more preferably from 20 to 70 μm. In addition, the island component preferably has a circular surface shape.

In the case of the sea-island structure, the sea component is preferably made of a curing reaction product including the isocyanate-terminated prepolymer (A) as a main component, and the sea component is preferably made of a curing reaction product including the isocyanate-terminated prepolymer (B) as a main component.

A polishing pad (polishing layer) of the invention is provided with a depression and a protrusion structure for holding and renewing a slurry. Though in a case where the polishing layer is formed with a fine foam, many openings are on a polishing surface thereof which works so as to hold the slurry, a depression and protrusion structure are preferably provided on the surface of the polishing side thereof in order to achieve more of holdability and renewal of the slurry or in order to prevent induction of dechuck error, breakage of a wafer or decrease in polishing efficiency. The shape of the depression and protrusion structure is not particularly limited insofar as slurry can be retained and renewed, and examples include latticed grooves, concentric circle-shaped grooves, through-holes, non-through-holes, polygonal prism, cylinder, spiral grooves, eccentric grooves, radial grooves, and a combination of these grooves. The groove pitch, groove width, groove thickness etc. are not particularly limited either, and are suitably determined to form grooves. These depression and protrusion structure are generally those having regularity, but the groove pitch, groove width, groove depth etc. can also be changed at each certain region to make retention and renewal of slurry desirable.

The method of forming the depression and protrusion structure is not particularly limited, and for example, formation by mechanical cutting with a jig such as a bite of predetermined size, formation by casting and curing resin in a mold having a specific surface shape, formation by pressing resin with a pressing plate having a specific surface shape, formation by photolithography, formation by a printing means, and formation by a laser light using a $CO_2$ gas laser or the like.

No specific limitation is placed on a thickness of a polishing layer, but a thickness thereof is about 0.8 to 4 mm, preferably 1.5 to 2.5 mm. The method of preparing the polishing layer of this thickness includes a method wherein a block of the fine-cell foam is cut in predetermined thickness by a slicer in a band saw system or a planing system, a method that involves casting resin into a mold having a cavity of predetermined thickness and curing the resin, a method of using coating techniques and sheet molding techniques, etc.

The scatter of the thickness of the polishing layer is preferably 100 µm or less. When the scatter of the thickness is higher than 100 µm, large undulation is caused to generate portions different in a contacting state with an object of polishing, thus adversely influencing polishing characteristics. To solve the scatter of the thickness of the polishing layer, the surface of the polishing layer is dressed generally in an initial stage of polishing by a dresser having abrasive grains of diamond deposited or fused thereon, but the polishing layer outside of the range described above requires a longer dressing time to reduce the efficiency of production.

As a method of suppressing the scatter of thickness, there is also a method of buffing the surface of the polishing layer having a predetermined thickness. Buffing is conducted preferably stepwise by using polishing sheets different in grain size.

A polishing pad of the invention may also be a laminate of a polishing layer and a cushion sheet adhered to each other.

The cushion sheet (cushion layer) compensates for characteristics of the polishing layer. The cushion layer is required for satisfying both planarity and uniformity which are in a tradeoff relationship in CMP. Planarity refers to flatness of a pattern region upon polishing an object of polishing having fine unevenness generated upon pattern formation, and uniformity refers to the uniformity of the whole of an object of polishing. Planarity is improved by the characteristics of the polishing layer, while uniformity is improved by the characteristics of the cushion layer. The cushion layer used in the polishing pad of the present invention is preferably softer than the polishing layer.

The material forming the cushion layer is not particularly limited, and examples of such material include a nonwoven fabric such as a polyester nonwoven fabric, a nylon nonwoven fabric or an acrylic nonwoven fabric, a nonwoven fabric impregnated with resin such as a polyester nonwoven fabric impregnated with polyurethane, polymer resin foam such as polyurethane foam and polyethylene foam, rubber resin such as butadiene rubber and isoprene rubber, and photosensitive resin.

Means for adhering the polishing layer to the cushion layer include: for example, a method in which a double-sided tape is sandwiched between the polishing layer and the cushion layer, followed by pressing.

The double-sided tape is of a common construction in which adhesive layers are provided on both surfaces of a substrate such as a nonwoven fabric or a film. It is preferable to use a film as a substrate with consideration given to prevention of permeation of a slurry into a cushion sheet. A composition of an adhesive layer is, for example, of a rubber-based adhesive, an acrylic-based adhesive or the like. An acrylic-based adhesive is preferable because of less of a content of metal ions, to which consideration is given. Since a polishing layer and a cushion sheet is sometimes different in composition from each other, different compositions are adopted in respective adhesive layers of double-sided tape to thereby also enable adhesive forces of the respective adhesive layers to be adjusted to proper values.

A polishing pad of the invention may be provided with a double-sided tape on the surface of the pad adhered to a platen. As the double-sided tape, a tape of a common construction can be used in which adhesive layers are, as described above, provided on both surfaces of a substrate. As the substrate, for example, a nonwoven fabric or a film is used. Preferably used is a film as a substrate since separation from the platen is necessary after the use of a polishing pad. As a composition of an adhesive layer, for example, a rubber-based adhesive or an acrylic-based adhesive is exemplified. Preferable is an acrylic-based adhesive because of less of metal ions in content to which consideration is given.

A semiconductor device is fabricated after operation in a step of polishing a surface of a semiconductor wafer with a polishing pad. The term, a semiconductor wafer, generally means a silicon wafer on which a wiring metal and an oxide layer are stacked. No specific limitation is imposed on a polishing method of a semiconductor wafer or a polishing apparatus, and polishing is performed with a polishing apparatus equipped, as shown in FIG. 1, with a polishing platen 2 supporting a polishing pad (a polishing layer) 1, a polishing head 5 holding a semiconductor wafer 4, a backing material for applying a uniform pressure against the wafer and a supply mechanism of a polishing agent 3. The polishing pad 1 is mounted on the polishing platen 2 by adhering the pad to the platen with a double-sided tape. The polishing platen 2 and the polishing head 5 are disposed so that the polishing pad 1 and the semiconductor wafer 4 supported or held by them oppositely face each other and provided with respective rotary shafts 6 and 7. A pressure mechanism for pressing the semiconductor wafer 4 to the polishing pad 1 is installed on the polishing head 5 side. During polishing, the semiconductor wafer 4 is polished by being pressed against the polishing pad 1 while the polishing platen 2 and the polishing head 5 are rotated and a slurry is fed. No specific limitation is placed on a flow rate of the slurry, a polishing load, a polishing platen rotation number and a wafer rotation number, which are properly adjusted.

Protrusions on the surface of the semiconductor wafer 4 are thereby removed and polished flatly. Thereafter, a semiconductor device is produced therefrom through dicing, bonding, packaging etc. The semiconductor device is used in an arithmetic processor, a memory etc.

EXAMPLES

Description will be given of the invention with examples, while the invention is not limited to description in the examples.
[Measurement and Evaluation Method]
(Measurement of Number-Average Molecular Weight)

A number-average molecular weight was measured by GPC (a Gel Permeation Chromatography) and a value as measured was converted in terms of standard polystyrene molecular weight, and the apparatus and conditions in operation were as follows:

GPC apparatus was an apparatus manufactured by Shimadzu Corp., with Model Number of LC-10A.

Columns that were used in measurement were ones manufactured by Polymer Laboratories Co., in which three columns were in connection including (PL gel, 5 μm and 500 Å), (PL gel, 5 μm and 100 Å) and (PL gel, 5 μm and 50 Å).

A flow rate was 1.0 ml/min.
A concentration was 1.0 g/l.
An injection quantity was 40 μl.
A column temperature was 40° C.
An eluent was tetrahydrofuran.
(Method of Calculating Oxycarbonyl Group Content)

The oxycarbonyl group content is calculated from the following formula: the oxycarbonyl group content (% by weight)={(the amount (parts by weight) of the polyester-based polyol)×(the weight ratio of the oxycarbonyl group in the repeating units of the polyester-based polyol)×100}/(the total amount (parts by weight) of the high-molecular weight polyols in the prepolymer-forming raw material compositions (a) and (b)).
(Measurement of Average Maximum Length of Island Component)

The produced, foamed or non-foamed polyurethane was cut into apiece (arbitrary size), and a smooth surface was cut out of the piece under an environment at −80° C. using a diamond knife in an ultramicrotome (LEICA EM UC6, manufactured by Leica). Subsequently, the smooth surface (measurement area: 30 μm×30 μm) was measured using a scanning probe microscope (SPM-9500, manufactured by Shimadzu Corporation) and a cantilever (OMCL-AC200TS-R3, manufactured by Olympus Corporation, 9 N/m in spring constant, 150 Hz in resonance frequency) under the conditions of a cantilever scanning speed of 1 Hz and a measurement temperature of 23° C. in the phase detection mode of the viscoelasticity measuring system. When the grayscale range of the resulting image was set at 2 V, image analysis software (WinRoof, Mitani Corporation) was used to display a grayscale image with clearly distinguishable islands. The maximum length of each of ten islands was measured in the measurement area of 30 μm×30 μm, and the average maximum length was calculated from the values.
(Measurement of Average Cell Size)

Using a microtome cutter, the produced polyurethane foam was cut as thin as possible into parallel pieces with a thickness of 1 mm or less, which were used as samples for average cell size measurement. The sample was fixed on a slide glass and observed at a magnification of 100 times using an SEM (S-3500N, Hitachi Science Systems, Ltd.). The diameters of all cells in an arbitrary area of the resulting image were measured using image analysis software (WinRoof, Mitani Corporation), and the average cell size (μm) was calculated.
(Measurement of Hardness)

Measurement is conducted according to JIS K6253-1997. The produced, foamed or non-foamed polyurethane cut out in a size of 2 cm×2 cm (thickness: arbitrary) was used as a sample for measurement of hardness and left for 16 hours in an environment of a temperature of 23±2° C. and a humidity of 50%±5%. At the time of measurement, samples were stuck on one another to a thickness of 6 mm or more. A hardness meter (Asker D Hardness Meter, manufactured by KOBUNSHI KEIKI CO., LTD.) was used. The hardness was measured at ten arbitrary points, and the average value was calculated.
(Measurement of Specific Gravity)

Determined according to JIS Z8807-1976. The produced, foamed or non-foamed polyurethane cut out in the form of a strip of 4 cm×8.5 cm (thickness: arbitrary) was used as a sample for measurement of specific gravity and left for 16 hours in an environment of a temperature of 23±2° C. and a humidity of 50%±5%. Measurement was conducted by using a specific gravity hydrometer (manufactured by Sartorius Co., Ltd).
(Evaluation of Polishing Property)

The polishing property of the produced polishing pad was evaluated using a polishing machine SPP600S (manufactured by Okamoto Machine Tool Works, Ltd.). The polishing rate was calculated from the amount of polishing, which was obtained when an 8-inch silicon wafer with a 2,000 Å thermal oxide film, a 100 Å Ta film, a 100 Å TaN film, and an 800 Å Cu-seed film deposited in this order thereon and a 25,000 Å plated copper film formed thereon was polished for 60 seconds per piece using the polishing pad. The average polishing rate was calculated from the polishing rates obtained for the 4th, 8th, and 12th pieces. The thickness of the Cu film was measured using a non-contact resistivity measuring system (Model-NC-80M, manufactured by Napson Corporation). The polishing conditions were as described below. The slurry used was a mixture obtained by adding 1% by weight of hydrogen peroxide to a neutral slurry for Cu (PL7101, manufactured by Fujimi Incorporated), which was added at a flow rate of 200 ml/minute during the polishing. The polishing load, the number of revolutions of the polishing platen, and the number of revolutions of the wafer were 2 psi, 70 rpm, and 70 rpm, respectively. Before the polishing, the surface of the polishing pad was dressed for 30 minutes using a diamond abrasive disc (M#100, manufactured by Asahi Diamond Industrial Co., Ltd.). The dressing conditions were a disc load of 0.6 psi, a number of revolutions of polishing platen of 30 rpm, and a number of revolutions of disc of 15 rpm.

Planarization property (dishing) was evaluated using an 8-inch patterned wafer (an 854-pattern wafer, manufactured by SEMATECH Inc.), in which the Cu film was completely removed by the polishing under the conditions described above. In the measurement of the complete removal of the Cu film, the instant at which the polishing temperature being monitored during the polishing decreased was determined as a polishing end point, and the polishing was stopped after over-polishing was performed for 10 seconds from the polishing end point. Subsequently, the step height (Å) (L/S=100 μm/100 μm) was measured using a step profilometer (P-15, manufactured by KLA-Tencor Corporation).

Scratching was evaluated as described below. After the polishing under the conditions described above, the wafer was cleaned with an alkaline cleaner (Juspen, manufactured by Sanyo Chemical Industries, Ltd.) in a wafer cleaning machine (MATZAB-8W2MC, manufactured by MAT Inc.). Using a surface defect inspection system (Surfscan SP1TBI, manufactured by KLA-Tencor Corporation), the cleaned wafer was measured to determine how many 0.24-2.0 μm scratches were there on the Cu film in the 5 mm EE (Edge Exclusion) area.

Example 1

To a vessel were added 934 parts by weight of toluene diisocyanate (a mixture of 2,4-diisocyanate/2,6-diisocyanate=80/20) and 2,666 parts by weight of polyethylene adipate glycol with a number average molecular weight of 1,000 and allowed to react at 70° C. for 4 hours, so that an isocyanate-terminated prepolymer (A) was obtained.

To a vessel were added 1,229 parts by weight of toluene diisocyanate (a mixture of 2,4-diisocyanate/2,6-diisocyanate=80/20), 272 parts by weight of 4,4'-dicyclohexylmethane diisocyanate, 1,901 parts by weight of polytetramethylene ether glycol with a number average molecular weight of 1,000, and 198 parts by weight of diethylene glycol and allowed to react at 70° C. for 4 hours, so that an isocyanate-terminated prepolymer (B) was obtained.

To a polymerization vessel were added 15 parts by weight of the prepolymer (A), 85 parts by weight of the prepolymer (B), and 3 parts by weight of a silicone surfactant (B8465, manufactured by Goldschmidt Chemical Corporation) and mixed. The mixture was adjusted to 70° C. in the vessel and was defoamed under reduced pressure. Subsequently, the reaction system was vigorously stirred for about 4 minutes with a stirring blade at a rotational speed of 900 rpm so that air bubbles were incorporated into the reaction system. Thereto was added 25.1 parts by weight of 4,4'-methylenebis(o-chloroaniline) (NCO Index: 1.1), which had been previously melted at 120° C. The liquid mixture was stirred for about 70 seconds and then poured into a loaf-shaped open mold (casting vessel). At the point when the liquid mixture lost its fluidity, it was placed in an oven, and subjected to post curing at 100° C. for 16 hours, so that a polyurethane foam block was obtained.

While heated at about 80° C., the polyurethane foam block was sliced using a slicer (VGW-125, manufactured by AMITEC Corporation), so that a polyurethane foam sheet was obtained. Subsequently, the surface of the sheet was buffed using a buffing machine (manufactured by AMITEC Corporation) until its thickness reached 1.27 mm, so that a sheet with regulated thickness accuracy was obtained. The buffed sheet was stamped into a piece with a diameter of 61 cm. Concentric circular grooves with a width of 0.25 mm, a pitch of 1.50 mm, and a depth of 0.40 mm were formed on the surface of the piece using a grooving machine (manufactured by Techno Corporation), so that a polishing layer was obtained. The surface of the polishing layer had a sea-island structure including island and sea components, in which the island component had a circular shape. A double-sided adhesive tape (DOUBLE TACK TAPE, manufactured by SEKISUI CHEMICAL CO., LTD.) was bonded to the opposite surface of the polishing layer from the grooved surface using a laminator. The surface of a corona-treated cushion sheet (Toraypef, a polyethylene foam, 0.8 mm in thickness, manufactured by Toray Industries, Inc.) was also buffed and then bonded to the double-sided adhesive tape using a laminator. A double-sided adhesive tape was further bonded to the other surface of the cushion sheet using a laminator, so that a polishing pad was obtained.

Examples 2 to 11 and Comparative Examples 1 to 3 and 7

Polishing pads were prepared by the same method as in Example 1, except that the formulations shown in Tables 1 and 2 were used instead. In each of Examples 2 to 11, the polishing layer had a sea-island structure including island and sea components, in which the island component had a circular shape. In each of Comparative Examples 1 to 3 and 7, the polishing layer did not have any phase-separated structure.

Example 12

Isocyanate-terminated prepolymers (A) and (B) were obtained by the same method as in Example 1. In a planetary mixing/defoaming machine, 25 parts by weight of the prepolymer (A) and 75 parts by weight of the prepolymer (B) were mixed and defoamed. Subsequently, 20.4 parts by weight of 4,4'-methylenebis(o-chloroaniline), which had been previously melted at 120° C., was added to the liquid mixture (NCO Index: 1.1) and mixed and defoamed in the planetary mixing/defoaming machine, so that a polyurethane-forming raw material composition was obtained. The composition was poured into an open mold (casting vessel) 800 mm in length and width and 2.5 mm in depth, and subjected to post curing at 100° C. for 16 hours, so that a non-foamed polyurethane sheet was obtained. Subsequently, the surface of the sheet was buffed using a buffing machine (manufactured by AMITEC Corporation) until its thickness reached 1.27 mm, so that a sheet with regulated thickness accuracy was obtained. The buffed sheet was stamped into a piece with a diameter of 61 cm. Concentric circular grooves with a width of 0.25 mm, a pitch of 1.50 mm, and a depth of 0.40 mm were formed on the surface of the piece using a grooving machine (manufactured by Techno Corporation), so that a polishing layer was obtained. The surface of the polishing layer had a sea-island structure including island and sea components, in which the island component had a circular shape. Subsequently, a polishing pad was prepared by the same method as in Example 1.

Comparative Examples 4 to 6

Polishing pads were prepared by the same method as in Example 12, except that the formulations shown in Table 2 were used instead. In each of Comparative Examples 4 to 6, the polishing layer did not have any phase-separated structure.

Comparative Example 8

To a vessel were added 1,081 parts by weight of toluene diisocyanate (a mixture of 2,4-diisocyanate/2,6-diisocyanate=80/20), 136 parts by weight of 4,4'-dicyclohexylmethane diisocyanate, 1,333 parts by weight of polyethylene adipate glycol with a number average molecular weight of 1,000, 950 parts by weight of polytetramethylene ether glycol with a number average molecular weight of 1,000, and 99 parts by weight of diethylene glycol, and allowed to react at 70° C. for 4 hours, so that an isocyanate-terminated prepolymer (C) was obtained.

To a polymerization vessel were added 100 parts by weight of the prepolymer (C) and 3 parts by weight of a silicone surfactant (B8465, manufactured by Goldschmidt Chemical Corporation) and mixed. The mixture was adjusted to 70° C. in the vessel and defoamed under reduced pressure. Subsequently, the reaction system was vigorously stirred for about 4 minutes with a stirring blade at a rotational speed of 900 rpm so that air bubbles were incorporated into the reaction system. To the reaction system was added 25.1 parts by weight of 4,4'-methylenebis(o-chloroaniline) (NCO Index: 1.1), which had been previously melted at 120° C. The liquid mixture was stirred for about 70 seconds and then poured into a loaf-shaped open mold (casting vessel). At the point when the liquid mixture lost its fluidity, it was placed in an oven, and subjected to post curing at 100° C. for 16 hours, so that a polyurethane foam block was obtained. Subsequently, a polishing pad was prepared by the same method as in Example 1. The polishing layer did not have any phase-separated structure.

TABLE 1

| | | Example 1 | Example 2 | Example 3 | Example 4 | Example 5 | Example 6 |
|---|---|---|---|---|---|---|---|
| Prepolymer (A) | Toluene diisocyanate (parts by weight) | 934 | 934 | 934 | 934 | 934 | 934 |
| | Polyethylene adipate glycol (parts by weight) | 2666 | 2666 | 2666 | 2666 | 2666 | 2666 |
| | Polybutylene adipate glycol (parts by weight) | — | — | — | — | — | — |
| | Polyhexamethylene adipate glycol (parts by weight) | — | — | — | — | — | — |
| Prepolymer (B) | Toluene diisocyanate (parts by weight) | 1229 | 1229 | 1229 | 1229 | 1229 | 1229 |
| | 4,4'-dicyclohexylmethane diisocyanate (parts by weight) | 272 | 272 | 272 | 272 | 272 | 272 |
| | Polytetramethylene ether glycol (parts by weight) | 1901 | 1901 | 1901 | 1901 | 1901 | 1901 |
| | Diethylene glycol (parts by weight) | 198 | 198 | 198 | 198 | 198 | 198 |
| Polishing layer | Prepolymer (A) (parts by weight) | 15 | 25 | 30 | 70 | 75 | 85 |
| | Prepolymer (B) (parts by weight) | 85 | 75 | 70 | 30 | 25 | 15 |
| | 4,4'-methylenebis(o-chloroaniline) (parts by weight) | 25.1 | 24.2 | 23.7 | 20.2 | 19.7 | 18.8 |
| | NCO Index | 1.1 | 1.1 | 1.1 | 1.1 | 1.1 | 1.1 |
| | Silicone surfactant (parts by weight) | 3 | 3 | 3 | 3 | 3 | 3 |
| | Oxycarbonyl group content (wt %) | 9.3 | 14.9 | 17.6 | 35.8 | 37.8 | 41.6 |
| | Foamed or non-foamed | Foamed | Foamed | Foamed | Foamed | Foamed | Foamed |
| Physical properties | Presence or absence of phase-separated structure | Present | Present | Present | Present | Present | Present |
| | Average maximum length (μm) of island component | 30 | 35 | 38 | 56 | 55 | 59 |
| | Average cell size (μm) | 45 | 46 | 44 | 42 | 40 | 40 |
| | D hardness (degrees) | 48 | 47 | 46 | 43 | 44 | 44 |
| | Specific gravity | 0.811 | 0.810 | 0.800 | 0.809 | 0.812 | 0.807 |
| | Average polishing rate (Å/min) | 13500 | 13000 | 10500 | 10025 | 10056 | 10098 |
| | Dishing (step height) (Å) | 950 | 975 | 1750 | 1830 | 1800 | 1820 |
| | Scratches (/wafer) | 206 | 208 | 198 | 179 | 187 | 165 |

| | | Example 7 | Example 8 | Example 9 | Example 10 | Example 11 | Example 12 |
|---|---|---|---|---|---|---|---|
| Prepolymer (A) | Toluene diisocyanate (parts by weight) | 934 | 934 | 934 | 934 | 934 | 934 |
| | Polyethylene adipate glycol (parts by weight) | 2666 | — | 1333 | — | — | 2666 |
| | Polybutylene adipate glycol (parts by weight) | — | 2666 | 1333 | — | 1333 | — |
| | Polyhexamethylene adipate glycol (parts by weight) | — | — | — | 2666 | 1333 | — |
| Prepolymer (B) | Toluene diisocyanate (parts by weight) | 1229 | 1229 | 1229 | 1229 | 1229 | 1229 |
| | 4,4'-dicyclohexylmethane diisocyanate (parts by weight) | 272 | 272 | 272 | 272 | 272 | 272 |
| | Polytetramethylene ether glycol (parts by weight) | 1901 | 1901 | 1901 | 1901 | 1901 | 1901 |
| | Diethylene glycol (parts by weight) | 198 | 198 | 198 | 198 | 198 | 198 |
| Polishing layer | Prepolymer (A) (parts by weight) | 50 | 40 | 40 | 50 | 40 | 25 |
| | Prepolymer (B) (parts by weight) | 50 | 60 | 60 | 50 | 60 | 75 |
| | 4,4'-methylenebis(o-chloroaniline) (parts by weight) | 21.9 | 24.2 | 24.2 | 22.4 | 24.2 | 20.4 |
| | NCO Index | 1.1 | 1.1 | 1.1 | 1.1 | 1.1 | 1.1 |
| | Silicone surfactant (parts by weight) | 3 | 3 | 3 | 3 | 3 | — |
| | Oxycarbonyl group content (wt %) | 27.3 | 19.9 | 21.3 | 21.4 | 18.8 | 14.9 |
| | Foamed or non-foamed | Foamed | Foamed | Foamed | Foamed | Foamed | Non-foamed |
| Physical properties | Presence or absence of phase-separated structure | Present | Present | Present | Present | Present | Present |
| | Average maximum length (μm) of island component | 48 | 45 | 45 | 48 | 45 | 35 |
| | Average cell size (μm) | 45 | 43 | 44 | 45 | 41 | — |
| | D hardness (degrees) | 45 | 43 | 45 | 40 | 41 | 65 |
| | Specific gravity | 0.809 | 0.807 | 0.815 | 0.810 | 0.800 | 1.210 |

TABLE 1-continued

| | | | | | | |
|---|---|---|---|---|---|---|
| Average polishing rate (Å/min) | 10250 | 13500 | 13700 | 13500 | 12850 | 11500 |
| Dishing (step height) (Å) | 1800 | 1200 | 1200 | 1200 | 1200 | 750 |
| Scratches (/wafer) | 184 | 160 | 205 | 145 | 123 | 245 |

TABLE 2

| | | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| Prepolymer (A) | Toluene diisocyanate (parts by weight) | — | 934 | 934 | — | 934 | 934 | 934 | — |
| | Polyethylene adipate glycol (parts by weight) | — | 2666 | 2666 | — | 2666 | 2666 | 2666 | — |
| | Polybutylene adipate glycol (parts by weight) | — | — | — | — | — | — | — | — |
| | Polyhexamethylene adipate glycol (parts by weight) | — | — | — | — | — | — | — | — |
| Prepolymer (B) | Toluene diisocyanate (parts by weight) | 1229 | 1229 | 1229 | 1229 | 1229 | 1229 | — | — |
| | 4,4'-dicyclohexylmethane diisocyanate (parts by weight) | 272 | 272 | 272 | 272 | 272 | 272 | — | — |
| | Polytetramethylene ether glycol (parts by weight) | 1901 | 1901 | 1901 | 1901 | 1901 | 1901 | — | — |
| | Diethylene glycol (parts by weight) | 198 | 198 | 198 | 198 | 198 | 198 | — | — |
| Prepolymer (C) | Toluene diisocyanate (parts by weight) | — | — | — | — | — | — | — | 1081 |
| | 4,4'-dicyclohexylmethane diisocyanate (parts by weight) | — | — | — | — | — | — | — | 136 |
| | Polyethylene adipate glycol (parts by weight) | — | — | — | — | — | — | — | 1333 |
| | Polytetramethylene ether glycol (parts by weight) | — | — | — | — | — | — | — | 950 |
| | Diethylene glycol (parts by weight) | — | — | — | — | — | — | — | 99 |
| Polishing layer | Prepolymer (A) (parts by weight) | — | 10 | 90 | — | 10 | 90 | 100 | — |
| | Prepolymer (B) (parts by weight) | 100 | 90 | 10 | 100 | 90 | 10 | — | — |
| | Prepolymer (C) (parts by weight) | — | — | — | — | — | — | — | 100 |
| | 4,4'-methylenebis(o-chloroaniline) (parts by weight) | 26.4 | 25.4 | 19.2 | 26.4 | 25.4 | 19.2 | 18.4 | 25.1 |
| | NCO Index | 1.1 | 1.1 | 1.1 | 1.1 | 1.1 | 1.1 | 1.1 | 1.1 |
| | Silicone surfactant (parts by weight) | 3 | 3 | 3 | — | — | — | 3 | 3 |
| | Oxycarbonyl group content (wt %) | — | 6.3 | 43.4 | — | 6.3 | 43.4 | 46.8 | 27.3 |
| | Foamed or non-foamed | Foamed | Foamed | Foamed | Non-foamed | Non-foamed | Non-foamed | Foamed | Foamed |
| Physical properties | Presence or absence of phase-separated structure | Absent | Absent | Absent | Absent | Absent | Absent | Absent | Absent |
| | Average maximum length (μm) of island component | — | — | — | — | — | — | — | — |
| | Average cell size (μm) | 45 | 46 | 46 | — | — | — | 48 | 47 |
| | D hardness (degrees) | 55 | 50 | 38 | 70 | 66 | 54 | 54 | 48 |
| | Specific gravity | 0.810 | 0.809 | 0.807 | 1.210 | 1.200 | 1.119 | 0.800 | 0.803 |
| | Average polishing rate (Å/min) | 9450 | 9200 | 9400 | 8630 | 8500 | 8360 | 8360 | 9500 |
| | Dishing (step height) (Å) | 2000 | 2000 | 2500 | 900 | 1000 | 1000 | 2000 | 1500 |
| | Scratches (/wafer) | 345 | 320 | 315 | 560 | 550 | 540 | 156 | 206 |

It is apparent from the results in Table 1 that the polishing pad of the invention provides a high level of polishing rate and planarization property and is less likely to cause scratching on the surface of a wafer.

In the drawings, reference numeral 1 represents a polishing pad (polishing layer), 2 a polishing platen, 3 a polishing agent (slurry), 4 a material being polished (semiconductor wafer), 5 a support (polishing head), and 6 and 7 each a rotating shaft.

The invention claimed is:

1. A polishing pad having a polishing layer,
    the polishing layer comprising a product of curing reaction of a polyurethane-forming raw material composition containing: an isocyanate-terminated prepolymer (A) obtained by reaction of a prepolymer-forming raw material composition (a) containing an isocyanate component and a polyester-based polyol; an isocyanate-terminated prepolymer (B) obtained by reaction of a prepolymer-forming raw material composition (b) containing an isocyanate component and a polyether-based polyol; and a chain extender, wherein the product of curing reaction has a phase-separated structure,
    wherein an amount of the isocyanate-terminated prepolymer (A) is from 15 to 570 parts by weight based on 100 parts by weight of the isocyanate-terminated prepolymer (B).

2. The polishing pad according to claim 1, wherein the phase-separated structure has island and sea components, wherein the island component has an average maximum length of 0.5 μm to 100 μm.

3. The polishing pad according to claim 1, wherein the total content of an oxycarbonyl group constituting the polyester-based polyol is from 8 to 43% by weight based on the total weight of high-molecular weight polyols in the prepolymer-forming raw material compositions (a) and (b).

4. The polishing pad according to claim 1, wherein the polyester-based polyol is at least one selected from the group consisting of polyethylene adipate glycol, polybutylene adipate glycol, and polyhexamethylene adipate glycol.

5. The polishing pad according to claim 1, wherein the polyether-based polyol is polytetramethylene ether glycol.

6. A method for manufacturing a semiconductor device, comprising the step of polishing a surface of a semiconductor wafer using the polishing pad according to claim 1.

\* \* \* \* \*